US010763776B2

(12) United States Patent
Bradley

(10) Patent No.: US 10,763,776 B2
(45) Date of Patent: Sep. 1, 2020

(54) TOTEM POLE SOLAR CAPTURE HOUSING UNIT

(71) Applicant: Patrick Michael Bradley, Cornwall (CA)

(72) Inventor: Patrick Michael Bradley, Cornwall (CA)

(\*) Notice: Subject to any disclaimer, the term of this patent is extended or adjusted under 35 U.S.C. 154(b) by 9 days.

(21) Appl. No.: 15/766,693

(22) PCT Filed: Aug. 14, 2017

(86) PCT No.: PCT/CA2017/050958
§ 371 (c)(1),
(2) Date: Apr. 6, 2018

(87) PCT Pub. No.: WO2018/035601
PCT Pub. Date: Mar. 1, 2018

(65) Prior Publication Data
US 2019/0173415 A1   Jun. 6, 2019

(30) Foreign Application Priority Data
Aug. 22, 2016 (CA) ..................................... 2939667

(51) Int. Cl.
*H02S 20/10* (2014.01)
*H01L 31/048* (2014.01)
*H02S 20/20* (2014.01)

(52) U.S. Cl.
CPC ............ *H02S 20/10* (2014.12); *H01L 31/048* (2013.01); *H02S 20/20* (2014.12); *Y02E 10/50* (2013.01)

(58) Field of Classification Search
CPC .............................................. E04H 12/00–348
See application file for complete search history.

(56) References Cited

U.S. PATENT DOCUMENTS 4,224,082 A   9/1980 Jacobson
6,060,658 A   5/2000 Yoshida et al.
(Continued)

FOREIGN PATENT DOCUMENTS

EP   2796774   10/2014
JP   2006-210666   8/2006
KR   20120093697 A  *  8/2012 .............. F21S 9/035

OTHER PUBLICATIONS

International Search Report and Written Opinion for Application No. PCT/CA2017/050958 dated Oct. 5, 2017, 7 pages.

*Primary Examiner* — William E McClain
(74) *Attorney, Agent, or Firm* — Burns & Levinson, LLP; George N. Chaclas

(57) ABSTRACT

The Totem Pole Solar Capture Housing is an improved design for a photo voltaic module enclosure. It is cylindrical in shape to capture the maximum amount of solar radiation on the housing's surface transferred to the module for conversion to electricity, and eliminates positional orientation. The cylindrical glass outer shell exposes one half of its circumference to solar radiation on contact. Used singly or in multiples interconnected together, one atop the other and erected vertically on a foot print. The inner photo voltaic module support core diameter and height can be sized to fit modules of different electrical outputs. The hollow center of the support core acts as the wiring channel to the base. Assembly couplings form the top and bottom of the enclosure and are critical in joining multiple enclosures into one vertical electrical output-enhanced assembly.

15 Claims, 10 Drawing Sheets

(56) References Cited

U.S. PATENT DOCUMENTS

2013/0335956 A1   12/2013  Scott et al.
2014/0360559 A1* 12/2014  Braghiroli ............... H02S 20/20
                                                            136/251

* cited by examiner

TOTEM POLE SOLAR CAPTURE HOUSING UNIT

CROSS-REFERENCE TO RELATED APPLICATIONS

This application is the U.S. national phase entry under 35 U.S.C. § 371 of International Application No. PCT/CA2017/050958, filed Aug. 14, 2017, entitled TOTEM POLE SOLAR CAPTURE HOUSING UNIT, which in turn claims priority to and benefit of Canadian Patent Application No. 2939667, filed Aug. 22, 2016; each of which is incorporated herein by reference in their entirety for all purposes.

FIELD OF THE INVENTION

This invention relates to the field of photovoltaics, more particularly to the field of housings for supporting photovoltaic modules.

BRIEF SUMMARY OF THE INVENTION

In one aspect, the present invention provides a photo voltaic module housing for vertical mounting, comprising a base, first and second assembly couplings, draw bands, an inner support tube, and an outer clear cylinder
the base having first assembly tabs protruding therefrom for securing the base to a supporting surface and second assembly tabs for securing the base to the first assembly coupling via one of the draw bands;
the first assembly coupling i) to be located above the base and below the inner support tube and the outer clear cylinder; ii) having a hollow cylindrical shape; iii) having one or more circular grooves on a top surface thereof for accommodating the bottom end portions of the inner support tube and the outer clear cylinder; and iv) having on the outer curved surface thereof a channel or ridges for seating one of the draw bands;
the second assembly coupling i) to be located above the inner support tube and the outer clear cylinder; ii) having a hollow cylindrical shape; iii) having one or more circular grooves on a bottom surface thereof for accommodating the top end portions of the inner support tube and the outer clear cylinder; and iv) having on the outer curved surface thereof a channel or a ridge for seating one of the draw bands;
the inner support tube i) being a hollow cylinder comprising an opening on a surface thereof; and ii) having a wall thickness that can be accommodated within one of the one or more circular grooves on the first and second assembly couplings;
the outer clear cylinder i) being a hollow cylinder having an inner diameter larger than the outer diameter of the inner support tube; ii) having a wall thickness that can be accommodated within one of the one or more circular grooves on the first and second assembly couplings; and iii) being made of material that is transparent to light of a wavelength suitable for generating electricity in a photovoltaic cell;
and the draw bands i) being a band of material that can be formed into a loop that can be tightened; ii) having a width that can be seated in the channel or ridges on the outer curved surface of the first and second assembly couplings; and iii) having assembly tabs or rings protruding therefrom for securing the draw band to the second assembly tabs on the base and/or for securing the draw band to one or more other draw bands and/or for securing the draw band to one or more guy wires.

In another aspect, the present invention provides a commercial package for a photo voltaic module housing for vertical mounting, which commercial package comprises two or more assembly couplings, two or more draw bands, one or more inner support tubes, and one or more outer clear cylinders as defined herein.

The above and other objects, features and advantages of the present invention will become apparent from the following description when taken in conjunction with the accompanying figures which illustrate embodiments of the present invention by way of example.

BRIEF DESCRIPTION OF THE DRAWINGS

Embodiments of the invention will be discussed with reference to the following Figures.

DETAILED DESCRIPTION OF THE INVENTION

Figure 1B:
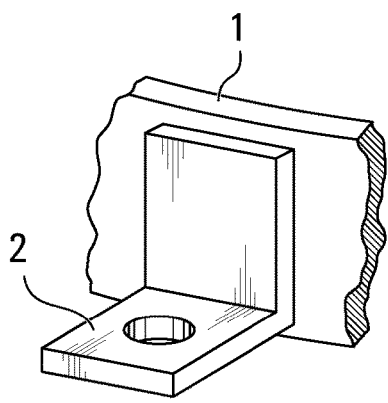
FIG. 1A is a top view of a draw band as described herein, FIG. 1B showing a perspective view of an assembly tab and FIG. 1C showing a side view of a guy-wire ring.

The Totem Pole Solar Capture Housing Unit is a vertically erected cylindrical assembly designed to provide maximum solar gain for a flexible wrap-around or cylindrical photovoltaic module (the flexible wrap-around photovoltaic module not being an essential element of the housing as described herein) mounted onto a support tube enclosed within the housing unit. The vertical position of the unit (units) allows for the optimum amount of available solar radiation to be received each day regardless of the sun's East to West movement or the sun's position relative to the horizon. As the sun engages the vertical cylinder one half of the circumference's width and the full height of the photovoltaic module is engaged converting the sun's radiation to electricity. As the sun moves East to West the solar contact on the photovoltaic module progresses around the circumference of the module maintaining full contact with half of the module's circumference and the full height of the module with no fall-off of solar radiation at the edges.

The Totem Pole system is designed to allow additional units to be stacked one atop the other with no increase in footprint for the cumulative electrical output of the combined photovoltaic units making it ideal for limited space installations to provide superior electrical gain per square area. The system is also advantageous for regions where fouling (i.e. obscurement) of photovoltaic modules by the elements (e.g. snow, sand, dirt) reduces conversion efficiency, as the vertical surfaces of the housing better resist fouling.

The Totem Pole Solar Capture Housing System is designed to improve the efficiency and output of Photo Voltaic Modules (Solar Cells) over flat rectangular panels. The totem pole solar capture housing system (hereafter referred to as units) is different in two principal ways: 1—each unit is erected vertically instead of horizontally, and 2—the shape of the unit is cylindrical. The unit (s) vertical erection eliminates the need to be oriented to the sun, while the cylindrical shape of the unit (s) assures that when the sun's rays strike the unit (s) the rays will cover one half of the unit's circumference. When the sun's path moves east to west, its rays will rotate around the cylindrical shape—during a twelve-hour day the sun's orientation will cover approximately 250 degrees of the unit's circumference, but the sun will shine on half the unit's circumference at all times. Thus, the housing does not need to be oriented to the sun either for east west movement or the sun's position relative to the horizon it can be placed anywhere the sun shines. Further regardless of the suns position relative to the horizon the unit's vertical stance assures equal exposure from top to bottom of the unit.

The unique compact stackable design allows for a minimal foot print with a big boost in electrical output compared to the foot print required for a flat panel. For example, a flat panel of 1640-mm in length×992-mm in height and a slope of 20 degrees, capable of producing 250-270 watts of power, would require a foot print of approximately of 4 square meters. By contrast a totem pole solar capture housing unit with a similar size photo voltaic module wrapped around a 522 mm diameter core×a height of 992 mm would require a footprint of less than 1 square meter (0.66 m), discounting any improvement in performance due to points 1 and 2 above and using the 250-270 watts as a standard and by mounting ten (10) units one atop the other the power produced would rise to 2500-2700 watts from the same 0.66 square meter, commercial and industrial applications need not restrict their power requirements via solar to the square area available for flat panels.

Different aspects of the invention are described below:

Aspect 1: In a first aspect, there is provided a photo voltaic module housing for vertical mounting, comprising a base (optionally made of metal, e.g. steel), first and second assembly couplings (made e.g. of plastic), draw bands (optionally made of metal, e.g. stainless steel), an inner support tube (made e.g. of plastic), and an outer clear cylinder (e.g. made of glass or plastic);

the base having first assembly tabs protruding therefrom (e.g. horizontal flat tabs perpendicular to the wall of the base) for securing the base to a supporting surface and second assembly tabs (e.g. horizontal flat tabs perpendicular to the wall of the base) for securing the base to the first assembly coupling via one of the draw bands;

the first assembly coupling i) to be located above the base and below the inner support tube and the outer clear cylinder; ii) having a hollow cylindrical shape; iii) having one or more circular grooves on a top surface thereof for accommodating the bottom end portions of the inner support tube and the outer clear cylinder (i.e. the one or more circular grooves have a diameter and width of a sufficient size to accept each of the end the inner support tube and outer clear cylinder); and iv) having on the outer curved surface thereof a channel or ridges for seating one of the draw bands (i.e. the draw band fits partially or wholly in the channel or fits between ridges);

the second assembly coupling i) to be located above the inner support tube and the outer clear cylinder; ii) having a hollow cylindrical shape; iii) having one or more circular grooves on a bottom surface thereof for accommodating the top end portions of the inner support tube and the outer clear cylinder; and iv) having on the outer curved surface thereof a channel or a ridge for seating one of the draw bands;

the inner support tube i) being a hollow cylinder comprising an opening on a surface thereof (e.g. for permitting wires from a photovoltaic module placed thereon to enter the hollow within the tube); and ii) having a wall thickness that can be accommodated within one of the one or more circular grooves on the first and second assembly couplings;

the outer clear cylinder i) being a hollow cylinder having an inner diameter larger than the outer diameter of the inner support tube (e.g. of a diameter sufficient to accommodate the inner support tube and a photovoltaic module that may be present thereon); ii) having a wall thickness that can be accommodated within one of the one or more circular grooves on the first and second assembly couplings; and iii) being made of material that is transparent to light of a wavelength suitable for generating electricity in a photovoltaic cell;

and the draw bands i) being a band of material that can be formed into a loop that can be tightened; ii) having a width that can be seated in the channel or ridges on the outer curved surface of the first and second assembly couplings; and iii) having assembly tabs or rings protruding therefrom (e.g. horizontal tabs perpendicular to the draw band outer surface) for securing the draw band to the second assembly tabs on the base and/or for securing the draw band to one or more other draw bands and/or for securing the draw band to one or more guy wires.

Aspect 2: In another aspect, there is provided the housing according to aspect 1, wherein the base is a hollow steel cylinder having an outer diameter similar to the outer diameter of the first assembly coupling and having an inner horizontal flange at the top thereof on which can sit the first assembly coupling. The base may also have a wall thickness of sufficient width to properly support the first assembly coupling.

Aspect 3: In another aspect, there is provided the housing according to aspect 1, wherein the base has an opening on a surface thereof to permit access to a hollow space therein. The opening may have any suitable shape and size, and it may be fitted with a removable cover.

Aspect 4: In another aspect, there is provided the housing according to any one of aspects 1 to 3, wherein the first assembly coupling has one or more circular grooves on a bottom surface thereof, and wherein the housing further comprises a further hollow cylinder portion that sits between the base and the first assembly coupling on the base and which has ridged portions on an upper surface thereof that fits within the one or more circular grooves on the bottom of the first assembly coupling.

Aspect 5: In another aspect, there is provided the housing according to any one of aspects 1 to 4, wherein the first and second assembly couplings are formed of plastic, and have identical one or more circular grooves on both top and bottom surfaces thereof.

Aspect 6: In another aspect, there is provided the housing according to any one of aspects 1 to 5, wherein the first and second assembly couplings have two circular grooves on both top and bottom surfaces thereof, the outer circular groove having a diameter and thickness to accommodate the outer clear cylinder and the inner circular groove having a diameter and thickness to accommodate the inner support tube.

Aspect 7: In another aspect, there is provided the housing according to aspect 6, wherein the outer circular groove comprises a circular O-ring which seats against the outer clear cylinder to form a seal between the outer clear cylinder and the assembly coupling.

Aspect 8: In another aspect, there is provided the housing according to any one of aspects 1 to 7, wherein the inner support tube has one or more substantially horizontal flanges extending outward from its circumference. These flanges can provide strength to the tube, which may permit the inner support tube to have a smaller wall thickness. The flanges may also provide a lip on which can rest a photovoltaic module placed in the housing.

Aspect 9: In another aspect, there is provided the housing according to any one of aspects 1 to 8, wherein the outer clear cylinder is made of glass or plastic. In one embodiment, the outer clear cylinder can have a fin spiraling around and extending from its surface to protect against side to side movement caused by wind flow against the housing.

Aspect 10: In another aspect, there is provided the housing according to any one of aspects 1 to 9, wherein the draw bands are each a stainless-steel band the ends of which are each bent substantially perpendicular to the band such that the ends face each other when the band is looped, and the band is tightened by a mechanism that forces the facing ends towards each other. Suitable mechanisms may be threaded, e.g. bolt and nut fitted through openings on each facing ends.

Aspect 11: In another aspect, there is provided the housing according to any one of aspects 1 to 10, wherein one or more of the draw bands comprise four assembly tabs for securing the draw bands to the base or to the draw band below it, four assembly tabs for securing the draw bands to the draw band above it, and three rings for securing the draw band to guy wires. The assembly tabs are optionally spaced equally around the draw band when seated on an assembly coupling.

Aspect 12: In another aspect, there is provided the housing according to any one of aspects 1 to 11, wherein metal rods are used to secure the second assembly tabs on the base to assembly tabs on the draw band above it and to secure assembly tabs on adjacent draw bands. In one embodiment, the lowest draw band is attached to the base with metal rods and is attached to the second draw band with four more metal rods, and every other draw band is attached by metal rods to each of the draw bands immediately above and below.

Aspect 13: In another aspect, there is provided the housing according to any one of aspects 1 to 12, which comprises one or more additional inner support tubes, one or more additional outer clear cylinders above the second assembly coupling each capped by additional assembly couplings to on which are seated additional draw bands. There is no absolute limit to the number of units that can be stacked, as long as the cumulative weight can be borne by the materials used and suitable guy-wires are used to maintain the housing vertical. If metal rods are used to support the draw bands and are properly secured, the weight of the housing is supported not by the inner support tube, the outer clear cylinder or the assembly couplings, but by the metal rods and the draw bands. It is thus possible to use lighter (and somewhat weaker) materials (e.g. plastic) for the inner support tube, the outer clear cylinder or the assembly couplings, while maintaining structural strength by using stronger materials (e.g. metal) for the rods and draw bands.

Aspect 14: In another aspect, there is provided the housing according to any one of aspects 1 to 13, which further comprises a domed or conical cap having a bottom hollow cylindrical portion with a diameter and wall thickness that can be accommodated in the one or more grooves in an uppermost assembly coupling. Such a cap avoids precipitation or dirt entering the inner hollow of the housing.

Aspect 15: A further aspect includes a commercial package which comprises two or more assembly couplings, two or more draw bands, one or more inner support tubes, and one or more outer clear cylinders as defined in any one of aspects 1 to 14.

EXAMPLES

The following examples are provided to illustrate the invention. It will be understood, however, that the specific details given in each example have been selected for purpose of illustration and are not to be construed as limiting the scope of the invention.

In some embodiments, the Totem Pole housing unit consists of the following components:
1) A steel round base
2) Optional load bearing plug
3) Assembly couplings
4) Stabilizing and assembly metal draw bands
5) Inner core photovoltaic module support tube
6) Tempered low iron glass (or a material with similar qualities) outer cylinder
7) Steel threaded assembly support rods
8) Press fit domed cap
9) Optional compression gaskets
10) Rubber O-rings
11) Nuts, bolts and washers The following is a description of the function and relationship of the various components of the Totem Pole photovoltaic housing unit. Measurements are approximate and are based on a flexible photovoltaic module of 1640-mm long by 992-mm high which again is not meant to be included in this patent application. Measurements may differ substantially, and the numbers bellow are provided only as a single example of the invention.

1) Steel Round Base

A steel base approximately 550-mm in diameter by a height of 200-mm augmented by a load bearing ring welded to the top of the base and supported by gussets. The open center of the ring allows for the passage of electrical wiring from the photovoltaic modules electrical wiring above. A wiring access door is provided on the outside of the base with a junction box for connection of wiring to the photovoltaic inverters located elsewhere. Pre-drilled 90-degree tabs projecting outward are welded to the bottom of the round base equally spaced around the circumference for mounting of the base to a solid flat surface. In addition, four pre-drilled 90-degree assembly tabs are welded to the outside of the round base equally spaced 90 degrees apart around the circumference 100-mm down from the top of the base to secure the first assembly coupling.

2) Optional Load Bearing Plug

A plastic load bearing plug with an open center is installed into the bottom of the first assembly coupling filling the grooves provided for the outer non-reflective glass cylinder and the inner photovoltaic support tube to assist in distributing the weight load of the assembled Totem Pole solar capture housing unit (s).

3) Assembly Coupling

The assembly coupling is an 87.5-mm thick plastic ring with a 550-mm. diameter equal to the diameter of the steel round base. The top and bottom of the assembly coupling are mirror images identical in all respects. Approximately 8-mm inward from the outside edge of the plastic ring on the top and bottom faces a 37-mm deep groove by a width equal to the thickness of the non-reflective glass cylinder is provided. On the outside wall of this groove and 6-mm down into it a rounded groove is established to provide for the insertion of a moisture barrier O-ring. At the bottom of the groove provided for the non-reflective glass cylinder a compression gasket is inserted to act as a cushion for the glass cylinder. A second groove set inward from the first groove and distanced by an air space and the thickness of the photovoltaic module is established on the top and bottom of the assembly coupling with a depth of 37-mm its width equal to the thickness of the inner core module support. From the inner width of this groove a support shoulder 12-mm wide is established its outer edge marking the beginning of the hollow wiring channel. On the outside vertical surface of the assembly coupling midway between the top and bottom of the assembly coupling a 31-mm wide groove is provided around the circumference its depth approx. 3.2-mm. to be determined by the thickness of the stabilizing and assembly draw band for a flush fit.

4) Stabilizing and Assembly Metal Draw Band

The stabilizing and assembly metal draw band is sized to fit into the vertical outside groove of the assembly coupling and wrap around the circumference of the assembly coupling. Each end of the draw band is bent outward at a 90-degree angle and pre-drilled to allow for a nut and bolt to draw the band tight to the assembly coupling. Eight (8) pre-drilled 90-degree 25 mm.×25 mm.×25 mm assembly tabs are welded to the outside face of the draw band 45 degrees distance from each and projecting outward, additional to these three (3) metal rings 25 mm. in diameter spaced approximately 120 degrees apart are welded to the outside face of the draw band to provide for the connection of stabilizing guy wires to ensure the vertical position of the Totem Pole Solar Capture Housing System is maintained.

The first assembly coupling is now ready to be connected to the steel round base. The optional load bearing plug may be inserted into the bottom of the assembly coupling and the steel draw band is loosely attached to the assembly coupling and aligned to the four assembly tabs 25 mm.×25 mm.×25 mm. set 90 degrees apart on the steel base and bolted tight to the assembly coupling. Next four (4) short threaded metal support and assembly rods are used to connect four of the draw band's assembly tabs to the four assembly tabs on the steel base and bolted tight.

5) Inner Core Photovoltaic Module Support Tube

The inner core module support tube as a diameter sized to accommodate a module approximately 1640-mm long by 992-mm high that wraps fully around the inner core support tube's circumference. Two ring discs project outward from the inner core tube each is located 37.5-mm from either end of the support tube to provide additional support for the photovoltaic module. A port hole in the main body of the inner core tube is provided to allow the module wiring into the hollow center and downward to the junction box located in the round base. The 37.5-mm length of the inner core tube above the upper support ring disc and the 37.5-mm length below the lower support ring disc fit into the inner groove of the upper and lower faces of the assembly couplings.

6) Outer Tempered Low Iron Glass Cylinder

The glass cylinder 1065-mm. high fits into the outside groove of the assembly couplings to a depth of 37.5-mm, its diameter is measured across the assembly coupling from the outside groove of either side of the assembly coupling at the center line.

7) Steel Assembly and Support Rods

Having installed the second (top) assembly coupling onto the inner core tube and the outer nonreflective glass cylinder a draw band is installed onto the top assembly coupling and loosely tightened then aligned to the remaining assembly tabs of the bottom assembly coupling and tightened firmly. Next four (4) steel threaded rods with a nut run up the threads on each end are fitted into the upper and lower assembly tabs of the upper and lower assembly couplings washers placed and the rod adjusted to project equal length of rod above and below the assembly tabs the nuts are tightened then a second washer and nut are run down either end sandwiching the assembly tabs arresting any up or down movement and adding strength to the unit. Stage one is now complete.

Stage Two

Additional housing units may now be assembled atop the first unit utilizing the open grooves of the first unit's top assembly coupling in the same fashion as the initial housing unit's assembly. Once the second unit is installed guy wires are attached to the upper assembly coupling's draw band's three rings and diagonally anchored firmly to a level equal to or below the round base. Every second housing unit installed above the initial two (2) units are similarly supported with guy wires.

8) Press Fit Domed Cap

When sufficient housing units have been installed to provide the desired electrical output and adequate guy wires have been installed to stabilize the vertical position of the assembled housing units a domed cap with a rim extending beyond the top assembly coupling's edge and a sleeve extending 37.5-mm below the rim having a diameter and width equal to the outside groove of the top assembly coupling is inserted into the groove completing the assembly. Vent holes are provided in the sleeve area above the 37.5-mm mark to vent to the outside between the domed cap and the assembly coupling.

The totem pole solar capture housing unit utilizes an outside sourced flexible photo voltaic module which is wrapped around and supported on a cylindrical inner core (FIGS. 4-25) the wiring for the photo voltaic modules are fed through the porthole provided (FIGS. 4-24) into the wiring channel (FIGS. 4-27) with sufficient length to reach the junction box located in the base (FIGS. 2-13) and surrounded by a non-reflective (e.g. tempered low iron) glass or plastic outer cylinder (FIG. 6) and erected vertically. Both of the ends (FIGS. 4-23) of the inner support core and the ends of the outer glass or plastic cylinder are fitted into the grooves of a plastic disc shaped couplings that feature double grooves 38 mm. deep on both faces (FIGS. 3-16, 19) after the O-rings (FIGS. 3-17) have been installed at the top and bottom of the coupling in the outside groove 8 mm. below the respective faces as a moisture barrier. For purpose of illustration only all measurements are metric and approximate. The disc shaped couplings measuring approximately 80 mm. high by 550 mm. in diameter have on the 80 mm. vertical face a centering groove 2 mm. deep by 38 mm. high around the circumference of the couplings into which a stainless steel draw band (FIG. 1) is inserted, loosely bolted to allow rotation to line up assembly tabs (FIGS. 1-2) on the upper and lower couplings, four of the assembly tabs that are 90 degrees apart are chosen and connected together as shown in FIG. 5B; check for plumb then tighten all nuts.

Figure 5A:
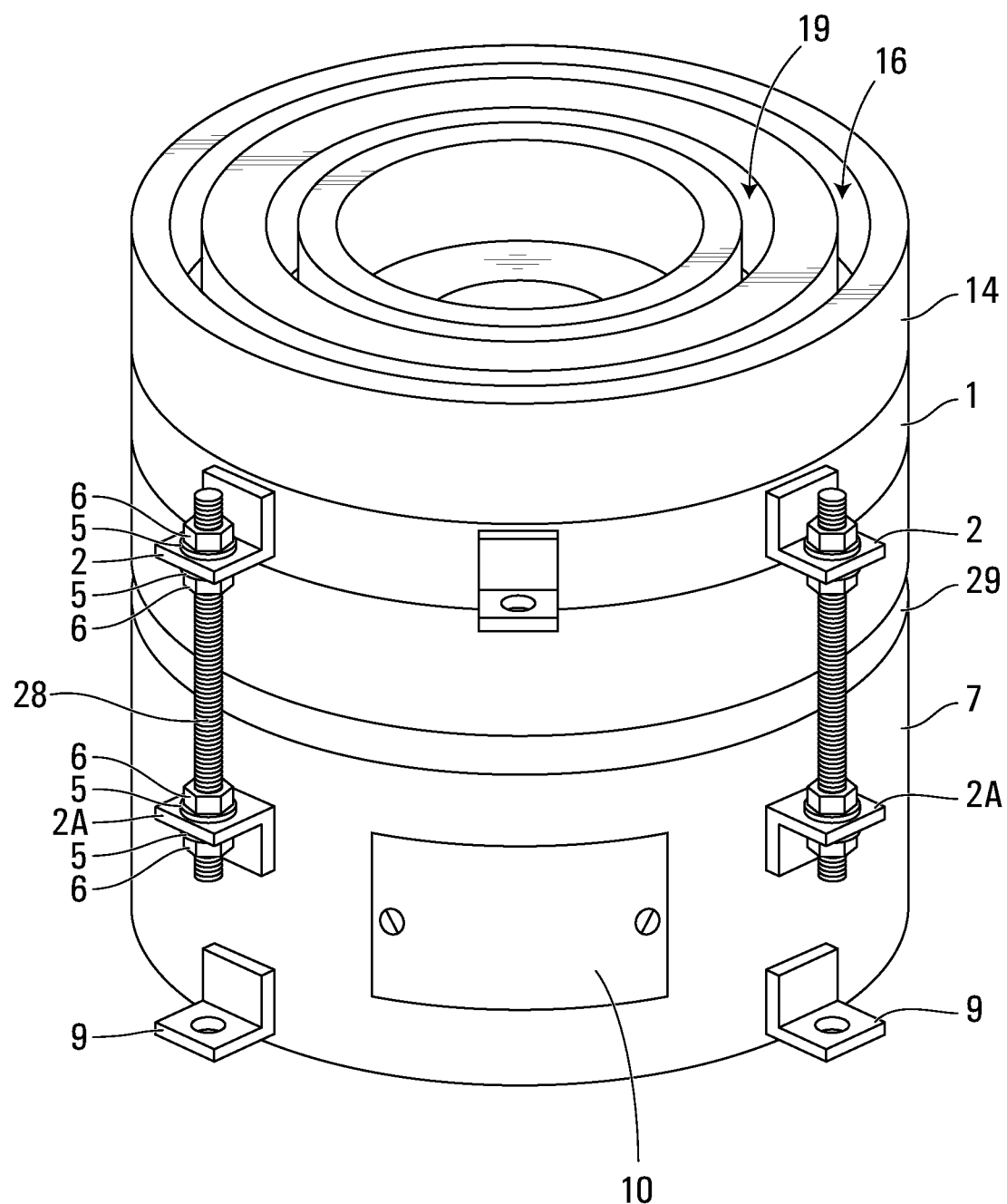
FIG. 5A is a perspective view of a base which is attached to an assembly coupling via a draw band by threaded metal rods.

This is considered to be one Solar Capture Housing unit, hereafter to be indicated as a unit. The unit is now ready to be attached to the steel base (FIG. 2-7) which has been securely fastened by way of brackets (FIG. 2-9) to a solid level surface. Using the four remaining assembly tabs (FIG. 2-2A) on the lower coupling with the four base assembly tabs join the unit and base as shown in FIG. 5A, remove the electrical access door (FIG. 2—10) and insert the wiring from the photo voltaic module into the junction box for later connection to the master cable going to the inverter (s), switches and batteries. The second and subsequent units can now be assembled one atop the other using the top coupling from the first unit as a starting point. At approximately every two and a half meters of height guy wires shall be attached to the guy wire rings (FIG. 1—3) on the draw band (FIG. 1—1) and be securely anchored to ground and adjusted for plumb with turn buckles.

PARTS DESCRIPTION BY NUMBERED FIGURES

Figure 1C:
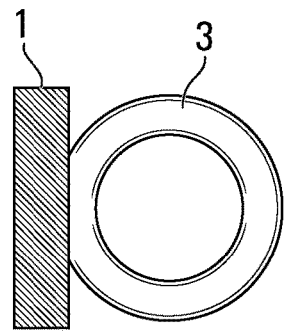
Figure 1A:
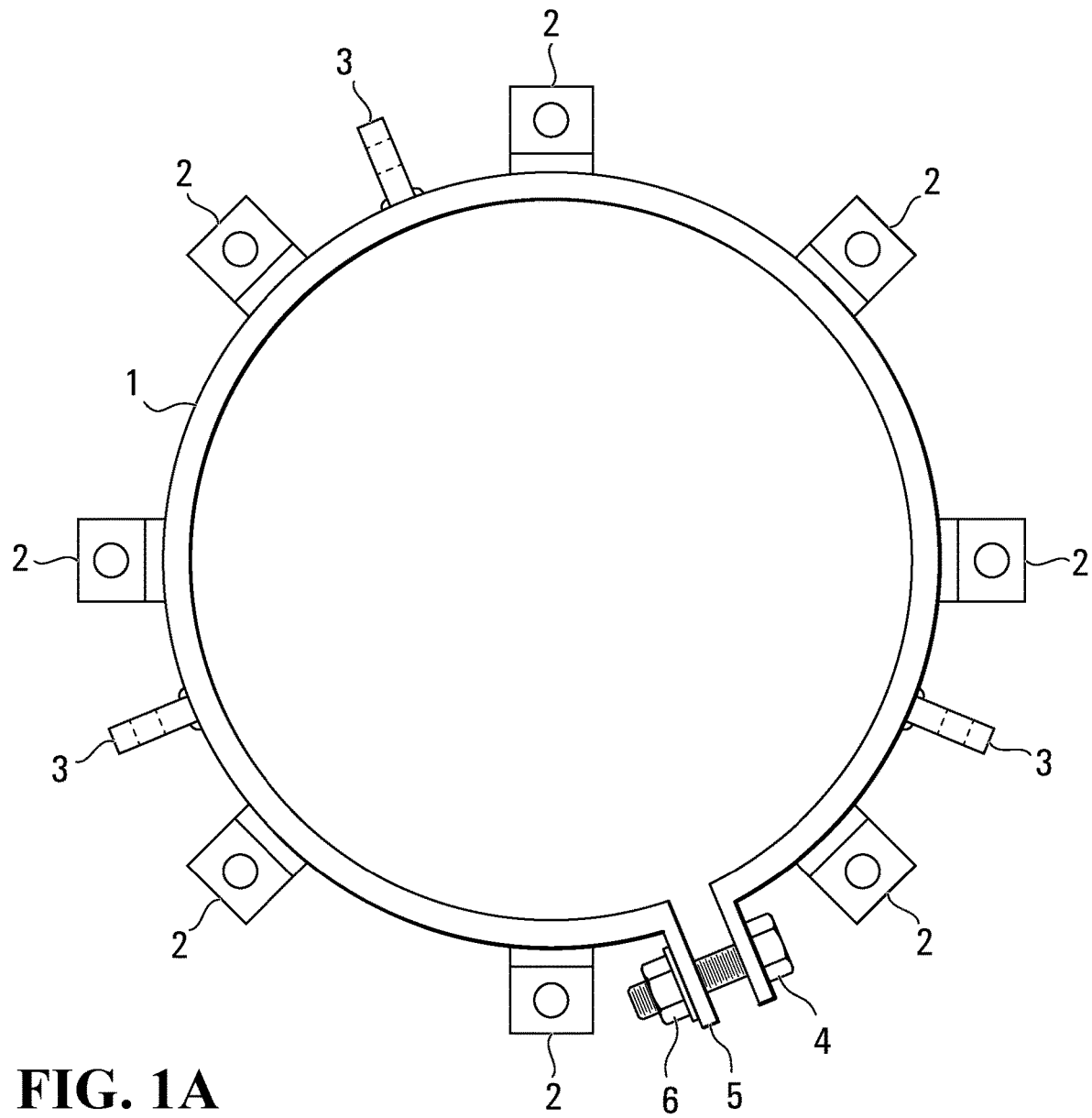
Figure 2:
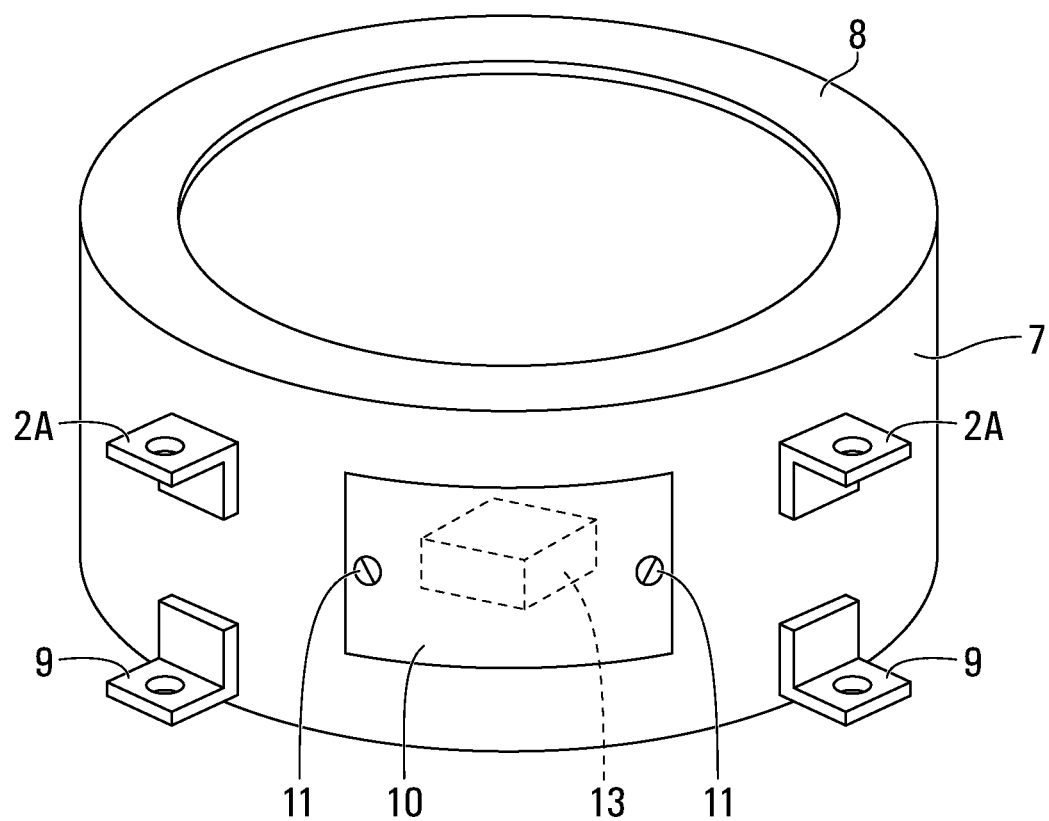
FIG. 2 is a perspective view of a base as defined herein.
Figure 3A:
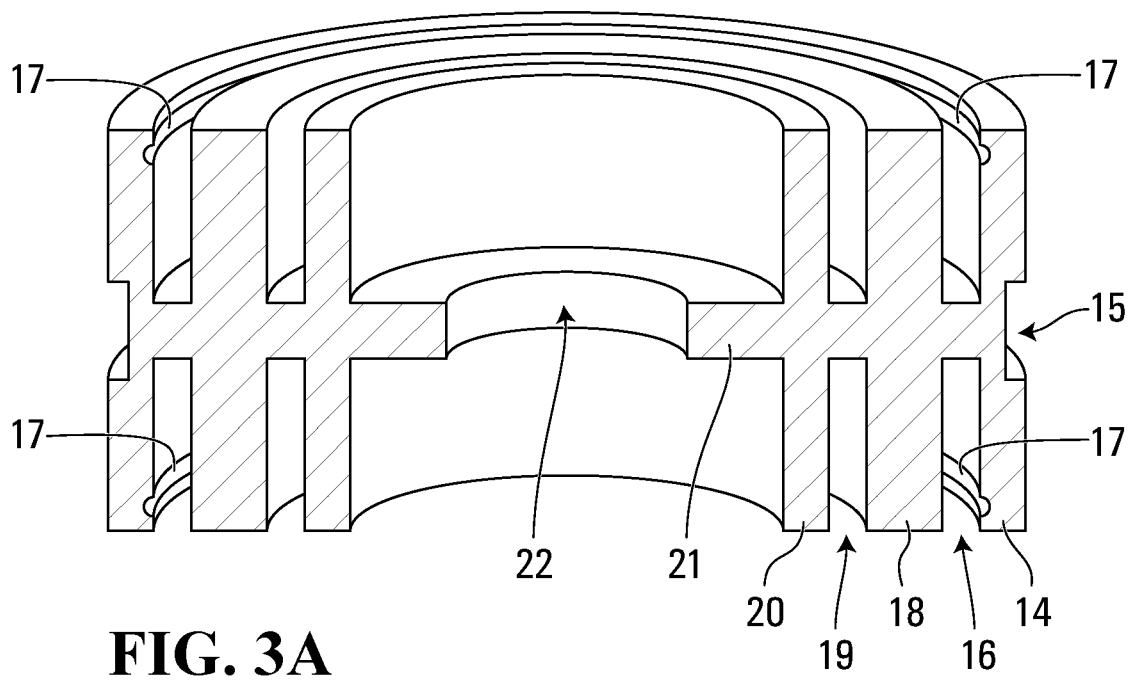
FIGS. 3A and 3B are respectively cross-sectional and top views of an assembly coupling as defined herein.
Figure 3B:
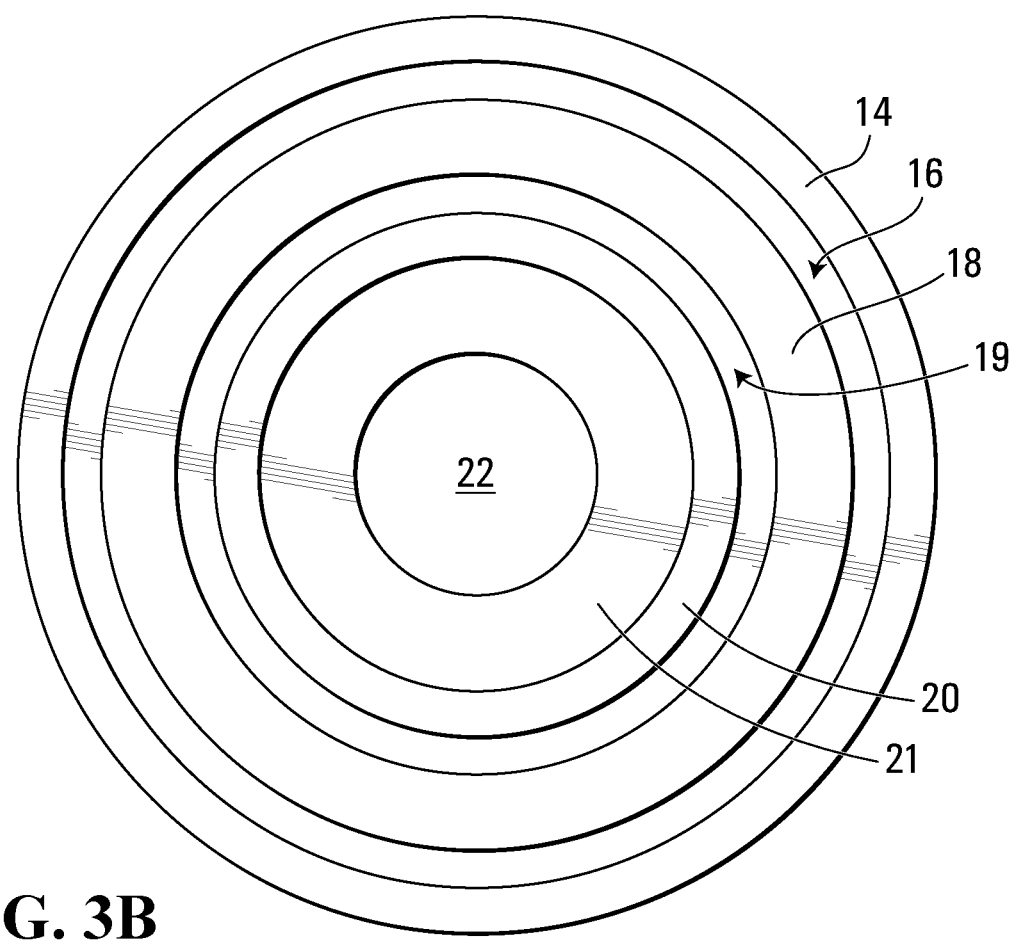
Figure 4A:
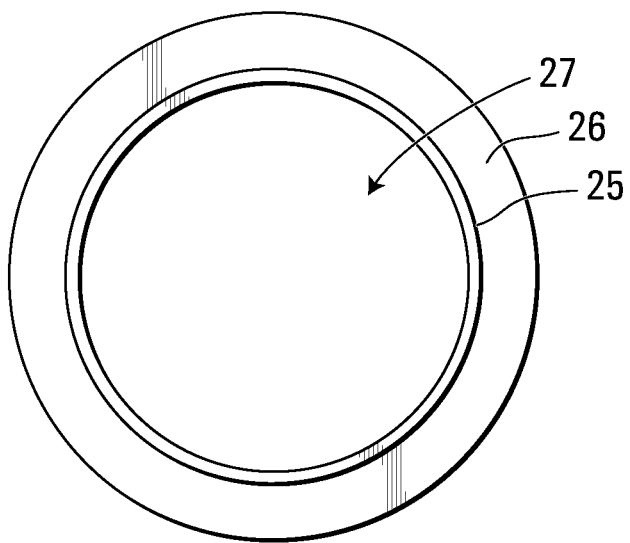
FIGS. 4A and 4B are respectively top and perspective view of an inner support tube as defined herein.
Figure 4B:
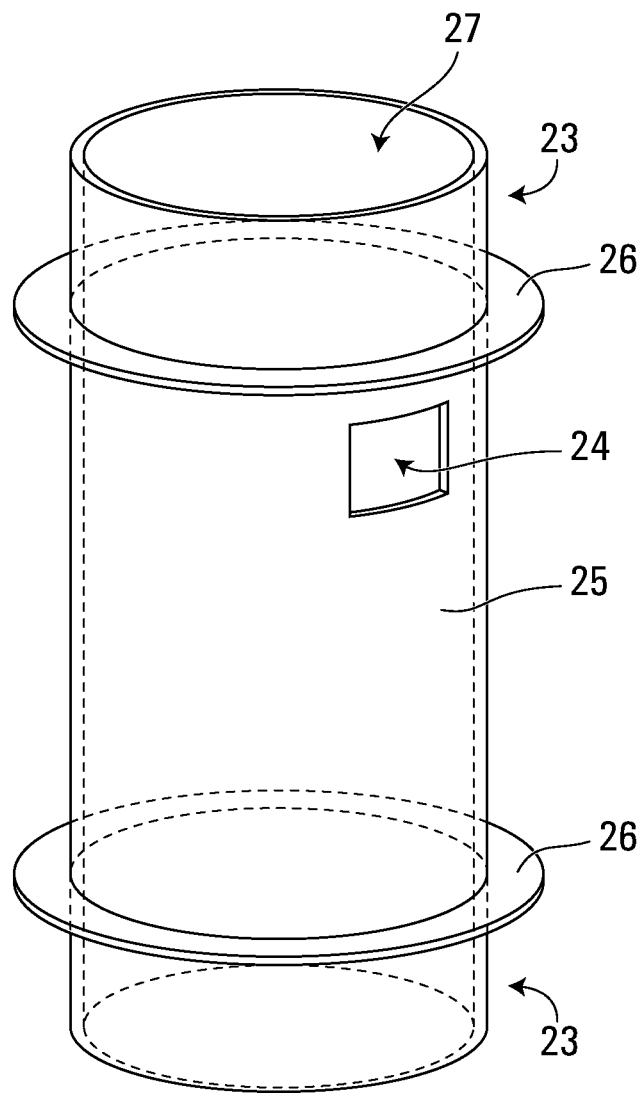
Figure 5B:
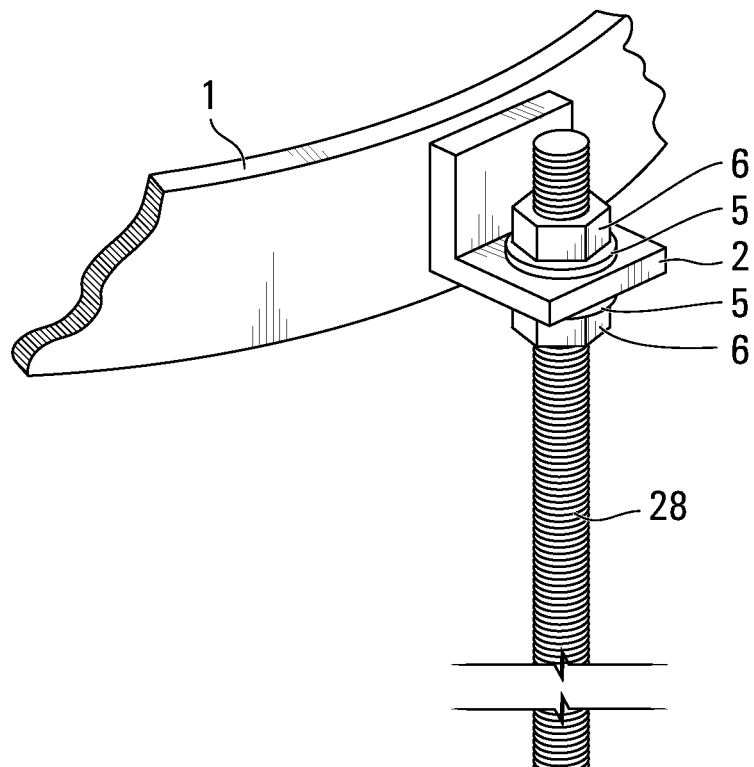
FIG. 5B shows the attachment of two draw bands using a threaded rod.
Figure 5B:
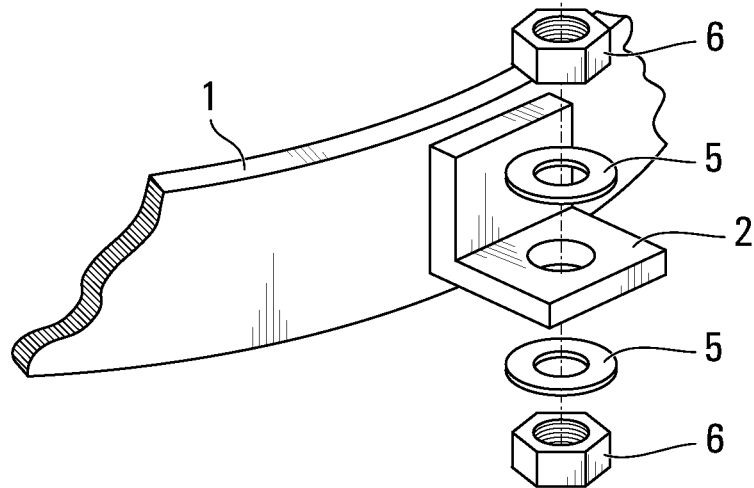

FIG. 1
FIG. 1—1 Draw band, FIG. 1—2 Assembly tabs, FIG. 1—3 Guy wire rings, FIG. 1—4 Bolt 10 mm.x32 mm., FIG. 1—5 Lock washer 10 mm., FIG. 1—6 Nut 10 mm.
FIG. 2
FIG. 2—7 Steel base, FIG. 2—8 Load bearing steel ring, FIG. 2—9 Base mounting tabs, FIG. 2—10 Electrical access door, FIG. 2—11 Access door mounting screws, FIG. 2-2A Assembly tabs, FIG. 2-13 Electrical junction box.
FIG. 3
FIG. 3—14 Outside diameter of coupling 550 mm., FIG. 3—15 Groove for draw band, FIG. 3—16 Location channel for outer cylinder, FIG. 3—17 Groove for 'O' ring moisture seal, FIG. 3—18 Shoulder, FIG. 3—19 Location channel for P.V. module support, FIG. 3—20 Shoulder, FIG. 3—21 Separation ring dividing top and bottom of coupling, FIG. 3—22 Electrical wiring channel.
FIG. 4
FIG. 4—23 Support core portion inserted into inner groove of coupling, FIG. 4—24 Wiring port opening into wiring channel, FIG. 4—25 Support core area reserved for Photo Voltaic module, FIG. 4—26 Photo Voltaic module support shelf, FIG. 4—27 Wiring channel to base.
FIG. 5
FIG. 5A showing assembly method for joining initial assembly coupling FIG. 5—14 to steel base FIG. 5—7 utilizing threaded rod 10 mm dia. FIG. 5—28 washers FIG. 5—5 nuts FIG. 5—6 sandwiching between them assembly tabs FIG. 5—2. A load bearing plug (5—29) is placed between the steel base and the initial assembly coupling FIG. 5B showing assembly method for joining couplings via stainless steel draw bands FIG. 5—1 then follow the assembly instructions listed above for FIG. 5A.
FIG. 6
FIG. 6—30 Outside non-reflective glass or plastic cylinder to be inserted into outside groove FIG. 3—18 of coupling FIG. 3—14.
FIG. 7
FIG. 7—31 Domed plastic cap with extended sleeve, FIG. 7—32 sleeve that fits into the outside groove of coupling FIG. 3—18, vent holes in the upper area of the sleeve lead from the wiring channel to the atmosphere are located inside the dome FIG. 7—33. The domed cap's diameter extends beyond the coupling's diameter to shed moisture.

Figure 6:
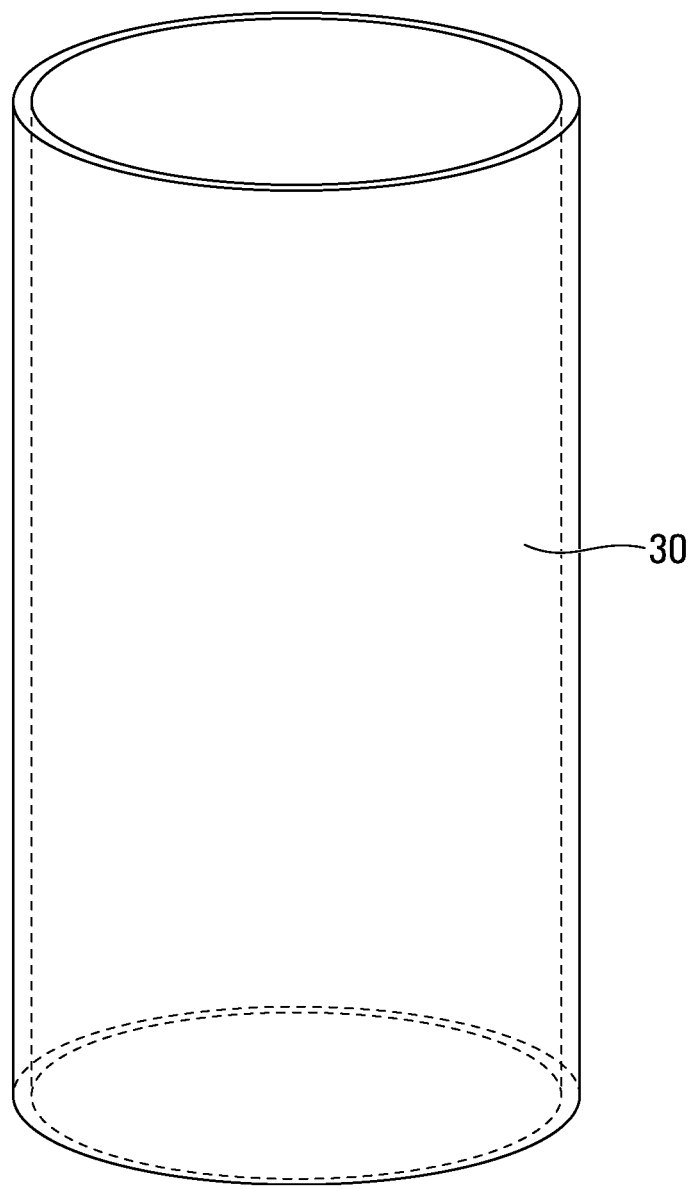
FIG. 6 is a perspective view of an outer clear cylinder as described herein.
Figure 7A:
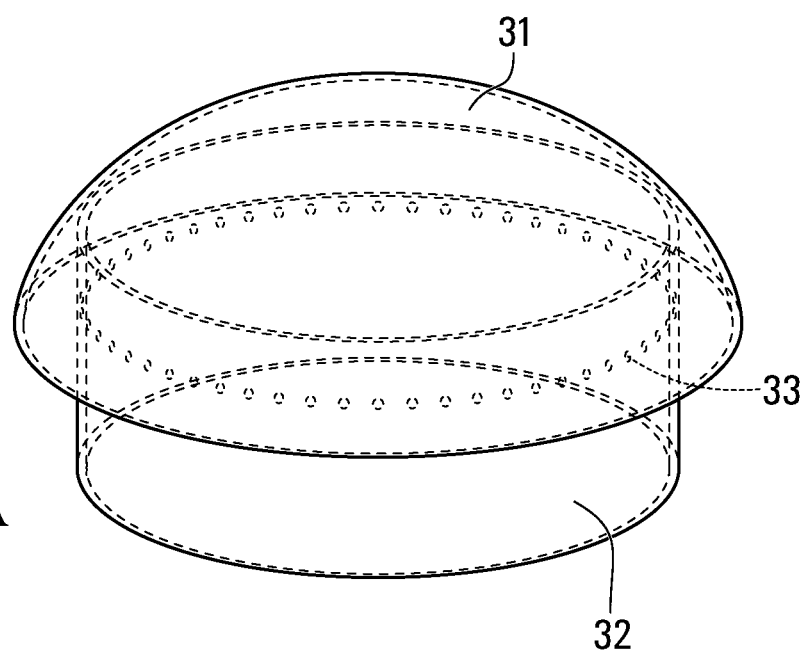
FIGS. 7A and 7B are respectively perspective and bottom views of a domed cap as described herein.
Figure 7B:
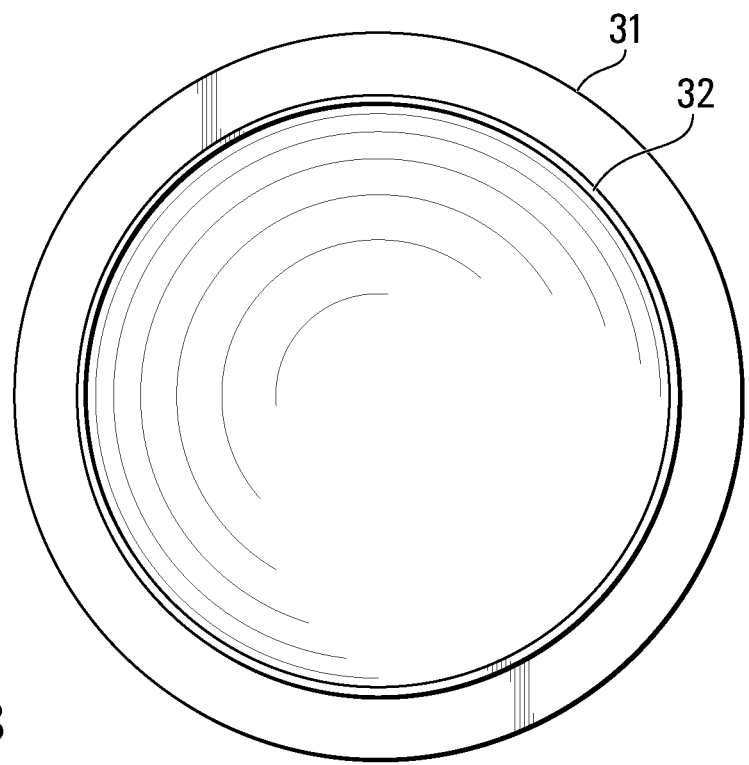
Figure 8:
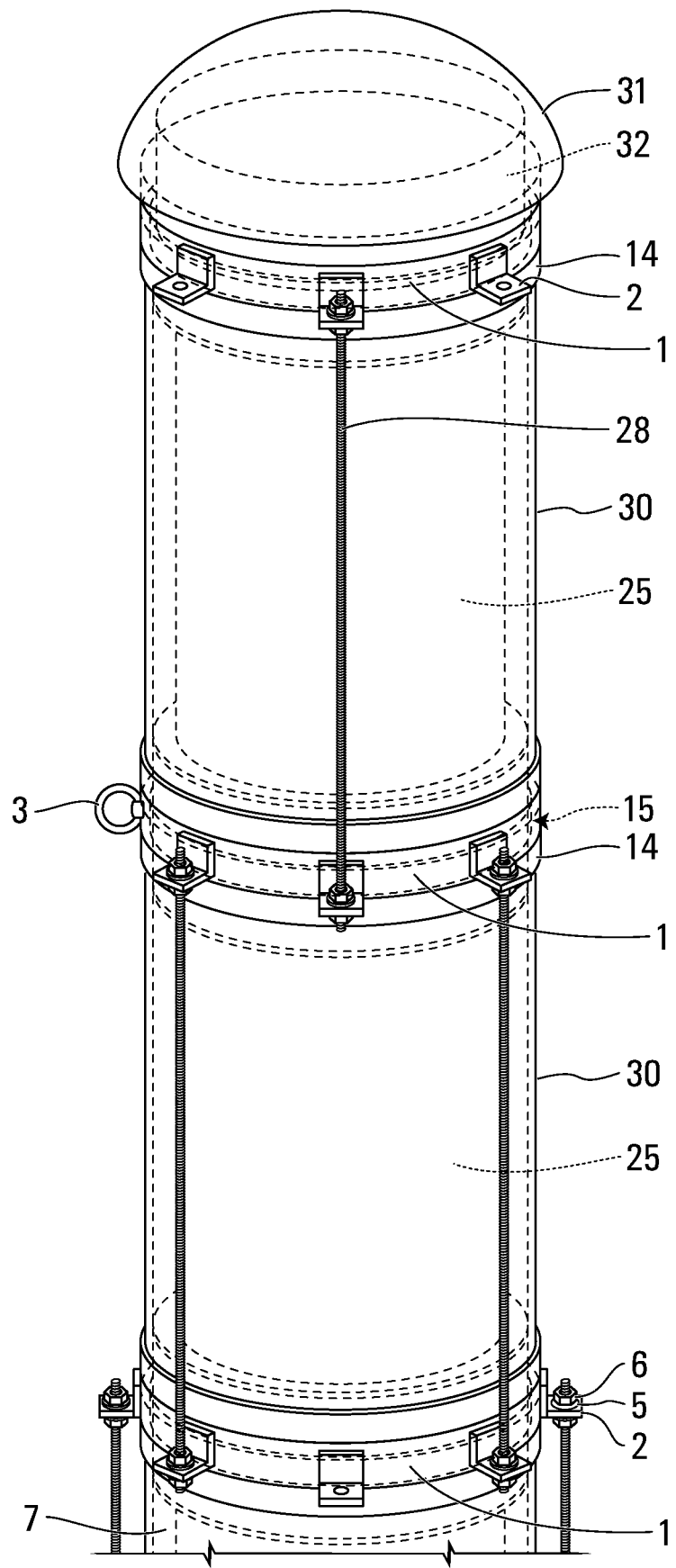
FIG. 8 is a perspective view of a housing as described herein comprising multiple stacked inner support tubes and outer clear cylinders separated by assembly couplings and guy wires and topped with a domed cap, the draw bands being secured by metal rods.

FIG. 8
FIG. 8 shows two (2) Solar Capture Housing units piggybacked one atop the other. The steel base FIG. 5—7 is connected to the initial coupling draw band FIG. 5—1 with threaded rod FIG. 5—28, nuts FIG. 5—6 and washers FIG. 5—5 utilizing the four (4) assembly tabs FIG. 5—2 located on the steel base FIG. 5—7 and four (4) assembly tabs FIG. 2 set ninety (90) degrees apart located on the draw band FIG. 5—2, both sets aligned and assembly as shown in FIG. 5A.

Utilizing the four (4) remaining assembly tabs FIG. 5—2 on the lower draw band FIG. 5—1 threaded rod FIG. 5—28 is used to join aligned lower and upper draw bands FIG. 5—1 utilizing four (4) assembly tabs FIG. 5—2 set Ninety (90) degrees apart on the upper draw band FIG. 5—2. Coupling to coupling draw band FIG. 8—1 assembly is shown in FIG. 5.

To assemble the second Solar Capture Housing unit the grooves FIGS. 3-18 & 19 of the top coupling of the lower unit are utilized to insert the inner support core FIG. 8—25 and outer glass or plastic cylinder FIG. 8—30 into and then the upper rims of FIGS. 8—25 & 30 are inserted into grooves FIGS. 3—18 & 19 of another coupling with a third draw band attached. Assembly tabs of the top draw band are lined up with the remaining four (4) assembly tabs on the second draw band and are attached together as shown in FIG. 5B.

Figure 9:
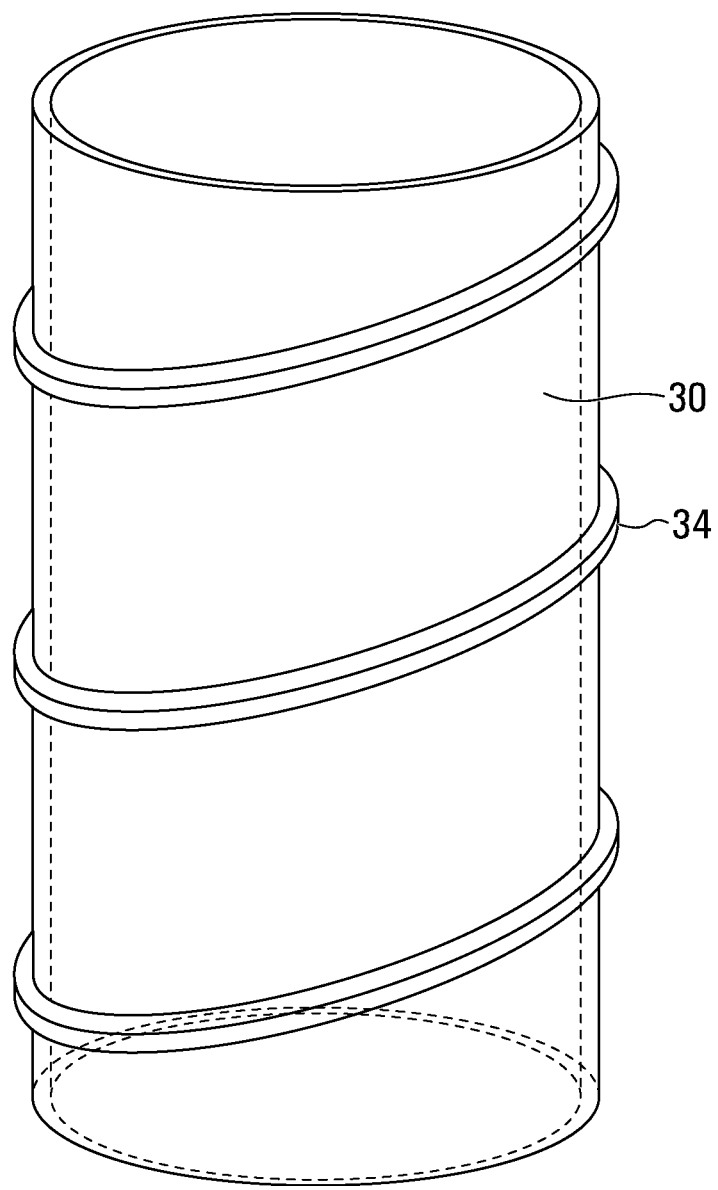
FIG. 9 is a perspective view of an outer clear cylinder with a helical fin.

Subsequent Solar Capture Housing units are assembled in a similar fashion as unit two. When sufficient units have been assembled one atop the other the last unit is fitted with a domed cap FIG. 7—31 and can now be wired to the master cable.
FIG. 9
FIG. 9 shows a glass or plastic outer cylinder (9—30) with a wind deflecting fin (9—34) incorporated on the outside surface of outer cylinder made of similar clear material projecting outward 6 mm.x6 mm. spiraling around the circumference of the outer cylinder to protect against side to side movement caused by wind flow against vertically stacked multiple housing units. The fin begins 40 mm. above the bottom raw lip and terminates 40 mm. below the top raw lip. This embodiment shown in FIG. 9 may be advantageous in locations where high winds are possible or prevalent.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

It must be noted that as used in this specification and the appended claims, the singular forms "a", "an", and "the" include plural reference unless the context clearly dictates otherwise. Unless defined otherwise all technical and scientific terms used herein have the same meaning as commonly understood to one of ordinary skill in the art to which this invention belongs.

The invention claimed is:
1. A photo voltaic module housing for vertical mounting, comprising
   a base, first and second assembly couplings, draw bands, an inner support tube, and an outer clear cylinder
   the base having first assembly tabs protruding therefrom for securing the base to a supporting surface and second assembly tabs for securing the base to the first assembly coupling via one of the draw bands;

the first assembly coupling:
  i) to be located above the base and below the inner support tube and the outer clear cylinder;
  ii) having a hollow cylindrical shape;
  iii) having one or more circular grooves on a top surface thereof for accommodating the bottom end portions of the inner support tube and the outer clear cylinder; and
  iv) having on the outer curved surface thereof a channel or ridges for seating one of the draw bands;
the second assembly coupling:
  i) to be located above the inner support tube and the outer clear cylinder;
  ii) having a hollow cylindrical shape;
  iii) having one or more circular grooves on a bottom surface thereof for accommodating the top end portions of the inner support tube and the outer clear cylinder; and
  iv) having on the outer curved surface thereof a channel or a ridge for seating one of the draw bands;
the inner support tube:
  i) being a hollow cylinder comprising an opening on a surface thereof; and
  ii) having a wall thickness that can be accommodated within one of the one or more circular grooves on the first and second assembly couplings;
the outer clear cylinder
  i) being a hollow cylinder having an inner diameter larger than the outer diameter of the inner support tube;
  ii) having a wall thickness that can be accommodated within one of the one or more circular grooves on the first and second assembly couplings; and
  iii) being made of material that is transparent to light of a wavelength suitable for generating electricity in a photovoltaic cell;
and the draw bands
  i) being a band of material that can be formed into a loop that can be tightened;
  ii) having a width that can be seated in the channel or ridges on the outer curved surface of the first and second assembly couplings; and
  iii) having assembly tabs or rings protruding therefrom for securing the draw band to the second assembly tabs on the base and/or for securing the draw band to one or more other draw bands and/or for securing the draw band to one or more guy wires.

2. The housing according to claim 1, wherein the base is a hollow steel cylinder having an outer diameter similar to the outer diameter of the first assembly coupling and having an inner horizontal flange at the top thereof on which can sit the first assembly coupling.

3. The housing according to claim 2, wherein the base has an opening on a surface thereof to permit access to a hollow space therein.

4. The housing according to claim 1, wherein the first assembly coupling has one or more circular grooves on a bottom surface thereof, and wherein the housing further comprises a further hollow cylinder portion that sits between the base and the first assembly coupling on the base and which has ridged portions on an upper surface thereof that fits within the one or more circular grooves on the bottom of the first assembly coupling.

5. The housing according to claim 1, wherein the first and second assembly couplings are formed of plastic, and have identical one or more circular grooves on both top and bottom surfaces thereof.

6. The housing according to claim 1, wherein the first and second assembly couplings have two more circular grooves on both top and bottom surfaces thereof, the outer circular groove having a diameter and thickness to accommodate the outer clear cylinder and the inner circular groove having a diameter and thickness to accommodate the inner support tube.

7. The housing according to claim 6, wherein the outer circular groove comprises a circular O-ring which seats against the outer clear cylinder to form a seal between the outer clear cylinder and the assembly coupling.

8. The housing according to claim 1, wherein the inner support tube has one or more substantially horizontal flanges extending outward from its circumference.

9. The housing according to any claim 1, wherein the outer clear cylinder is made of glass or plastic.

10. The housing according to claim 1, wherein the draw bands are each a stainless-steel band the ends of which are each bent substantially perpendicular to the band such that the ends face each other when the band is looped, and the band is tightened by a mechanism that forces the facing ends towards each other.

11. The housing according to claim 1, wherein one or more of the draw bands comprise four assembly tabs for securing the draw bands to the base or to the draw band below it, four assembly tabs for securing the draw bands to the draw band above it, and three rings for securing the draw band to guy wires.

12. The housing according to claim 1, wherein metal rods are used to secure the second assembly tabs on the base to assembly tabs on the draw band above it and to secure assembly tabs on adjacent draw bands.

13. The housing according to claim 1, which comprises one or more additional inner support tubes, one or more additional outer clear cylinders above the second assembly coupling each capped by additional assembly couplings to on which are seated additional draw bands.

14. The housing according to claim 1, which further comprises a domed or conical cap having a bottom hollow cylindrical portion with a diameter and wall thickness that can be accommodated in the one or more grooves in an uppermost assembly coupling.

15. A commercial package which comprises two or more assembly couplings, two or more draw bands, one or more inner support tubes, and one or more outer clear cylinders as defined in claim 1.

* * * * *